United States Patent [19]

Palmer et al.

[11] 4,188,575
[45] Feb. 12, 1980

[54] KEY OPERATED METER ACCESS LOCK AND RESET MECHANISM

[75] Inventors: Ansell W. Palmer, Hampton, N.H.; Francis J. Stevens, North Berwick, Me.

[73] Assignee: General Electric Company, Somersworth, N.H.

[21] Appl. No.: 914,218

[22] Filed: Jun. 9, 1978

[51] Int. Cl.² ............... G01R 11/64; G06C 15/42
[52] U.S. Cl. ....................... 324/103 R; 70/134; 235/144 MA; 324/157
[58] Field of Search ............ 324/116, 103 R, 157; 235/144 MA; 340/542; 70/DIG. 30, 134; 200/44, 330, 61.62, 61.67, 61.68

[56] References Cited

U.S. PATENT DOCUMENTS

| 174,182 | 2/1976 | Bates | 70/339 |
|---|---|---|---|
| 856,556 | 6/1907 | Townsend | 70/339 |
| 1,482,189 | 1/1924 | Heyer | 70/339 |
| 1,561,901 | 11/1925 | Benham | 70/339 |
| 2,465,146 | 3/1949 | Broussard | 70/263 |
| 3,866,164 | 2/1975 | Peterson | 340/542 |
| 3,908,166 | 9/1975 | Shackford | 324/103 R |
| 4,050,020 | 9/1977 | Germer et al. | 324/116 |

*Primary Examiner*—Rudolph V. Rolinec
*Assistant Examiner*—Ernest F. Karlsen
*Attorney, Agent, or Firm*—Robert E. Brunson; Francis X. Doyle

[57] ABSTRACT

A meter cover (housing) mounted mechanism incorporating a combination key operated tamper resistant security lock, externally controllable meter reset actuator and meter access hatch.

17 Claims, 7 Drawing Figures

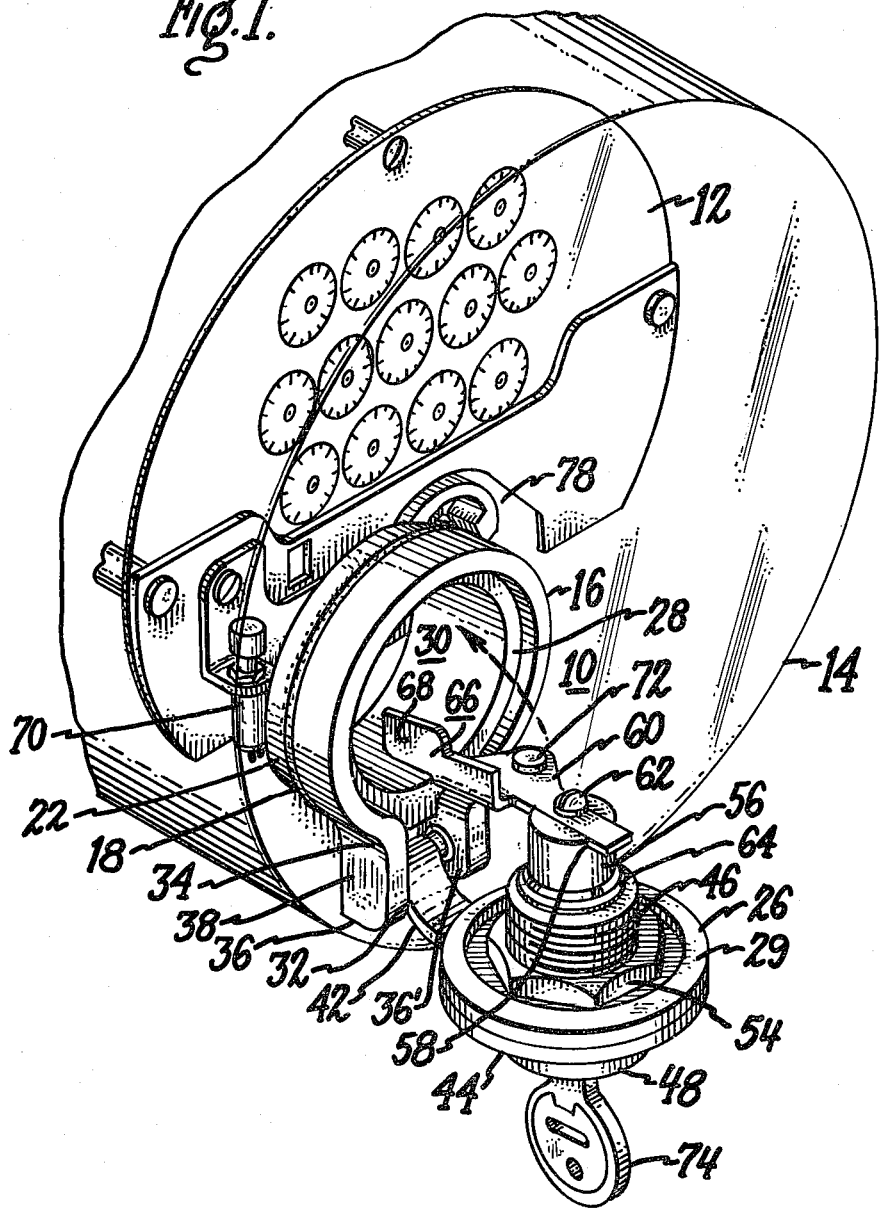

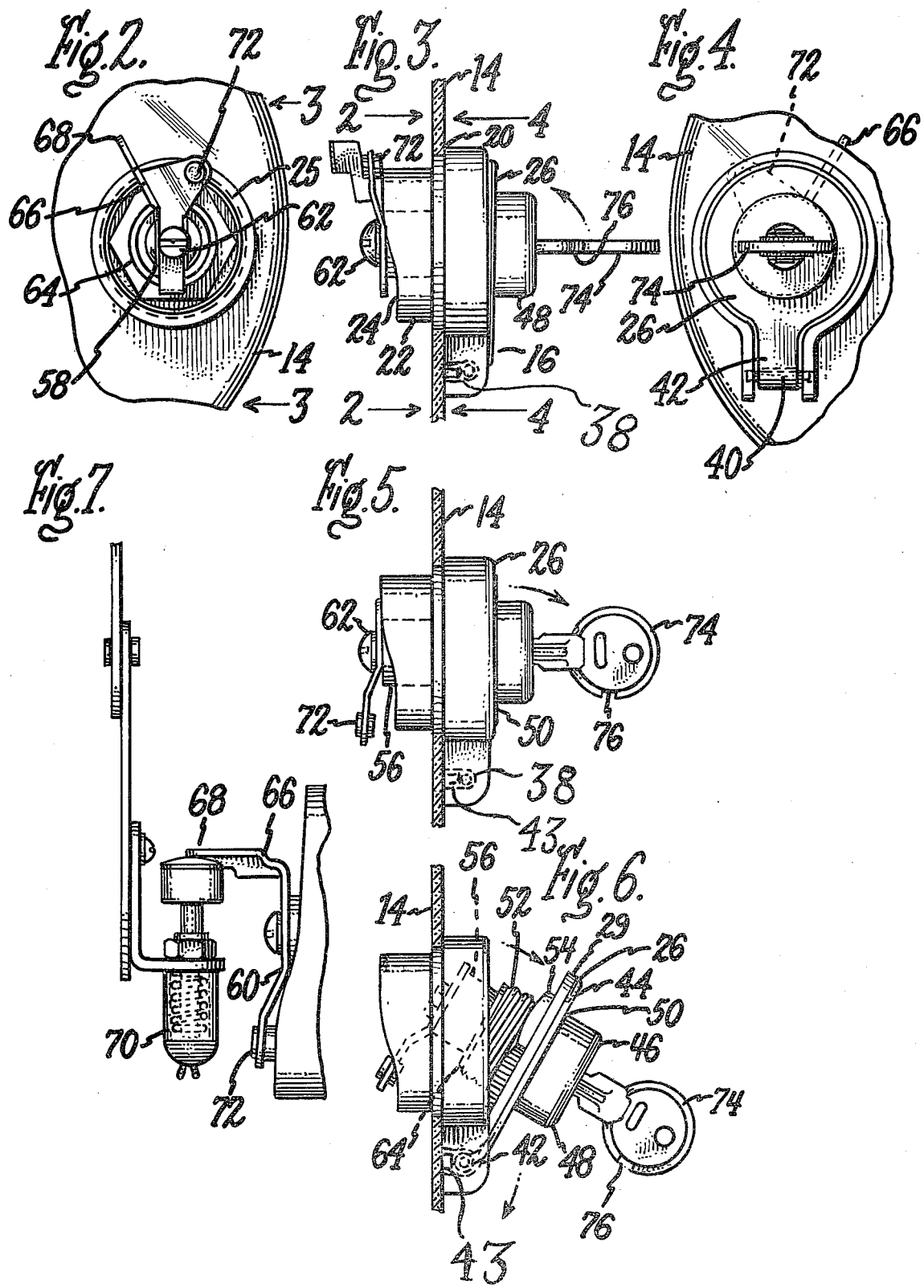

KEY OPERATED METER ACCESS LOCK AND RESET MECHANISM

BACKGROUND OF THE INVENTION

The present invention relates generally to a watthour demand meter and more particularly to a cover (housing) mounted meter register reset actuator incorporating a tamper resistant security lock and meter register access assembly.

Watthour demand meters are well known in the prior art. A common type of demand meter currently in use by the electric utility industry is a conventional watthour meter mechanism, used in combination with a timing element, to sum up the kilowatt hours of energy measured by the watthour meter in a pre-selected time span called a demand interval. Usually a demand interval of 15 or 30 minutes is selected for such meters. In order to indicate the maximum power demand on a customer's system in a given billing period, such as during a one month span, an indicating mechanism, such as a demand register indicator, is incorporated in all demand meters. At the end of the billing period the demand register is generally read by a utility company employee. After the register has been read, the register is reset back to zero. Thus, the indicator, as it moves up scale, registers the amount of peak power consumed during any demand interval in the subsequent billing period.

There are various types of meters having demand registers, the majority of which are either mechanical or electromechanical. However, one known type of meter which registers peak and demand power consumption has electronically programmable logic for controlling the operation of the peak and demand registers in that meter. Such a meter is described in U.S. patent application Ser. No. 881,503, filed on Feb. 27, 1978, entitled "TIME OF DAY DEMAND METERING SYSTEM AND METHOD", and U.S. Pat. No. 4,050,020, both assigned to the assignee of the present invention. In this type of meter it is desirable to be able to reset the demand register electronics from outside the meter, as well as being able to gain access to the meter electronics through the meter housing to program the electronic logic without physically removing the meter housing.

To accomplish the aforementioned register reset and programming functions, a need exists for a combination register reset and access assembly which can be securely locked to prevent unauthorized access or meter tampering and which, when locked, seals the register housing to prevent register contamination caused by external elements, such as blowing dust, rain and the like.

SUMMARY OF THE INVENTION

A primary object of the present invention is to provide a cover (housing) mounted reset actuator and access assembly for a demand register which incorporates a key operated tamper resistant security lock.

It is another object of the present invention to provide apparatus for gaining access to a meter register and for carrying out control functions of the register from the outside of a housing containing the register.

Another object of the present invention is to provide a housing mounted access hatch and rotary motion reset actuator which allows access to a device inside its housing and which allows the device to be controlled from outside the housing by the reset actuator.

A still further object of the present invention is to provide a meter cover mounted dual key access hatch and rotary motion reset actuator assembly which allows the hatch to be opened with one key for access to a register inside the meter cover and which allows the register to be reset by the actuator from the outside of the housing using a different key.

Another object of the present invention is to provide a lockable weather resistant meter cover mounted access and reset actuator security lock assembly having enhanced operating capabilities.

Yet another object of the present invention is to provide a meter cover mounted access and reset actuator assembly for gaining access to the electronics of an electronically programmable demand register to program the electronics and for resetting the demand register electronics from the outside of the meter cover.

The present invention accomplishes the foregoing objects by the provision of a meter housing mounted access and actuator apparatus for use with a meter of the type having a controllable register disposed inside the housing and which requires periodic access for the servicing of the register.

An apertured base extends through the housing and has a cam surface on the end thereof extending into the meter housing. An actuable control means, such as a reset switch, is mounted inside the housing adjacent the base and communicates with the register to impart a control function to the register when it is actuated.

An apertured hatch assembly is pivotally attached, such as by a hinge, to the base. The hatch is configured to come into sealing engagement with the aperture in the base to seal off the housing when the hatch is closed and to provide an access port to the register when the hatch is open.

A rotatable shaft is mounted in the aperture of the hatch assembly and has an actuator-lock arm mounted on one end of the shaft for coaxial rotation therewith. The actuator-lock arm is attached to that end of the shaft which enters the aperture of the hatch assembly.

The hatch is opened for access to the register by rotating the shaft and actuator-lock arm in a first direction to a first position which allows the actuator-lock arm to clear the cam surface and an inside wall of the base whereby the hatch may be hinged open.

With the hatch closed, rotation of the actuator-lock arm in a second or opposite direction causes the arm to contact the cam surface at a second position, thereby locking the hatch and preventing access to the register.

Actuation of the control means is accomplished with the hatch in the locked position while rotating the actuator-lock arm in the second direction through the second position until the actuator-lock arm contacts the control means to impart a control function to the register. The actuator-lock arm remains in frictional contact with the cam surface during its rotation in the second direction to thereby keep the apparatus or hatch assembly locked while performing the actuator control function.

Rotational torque applied to the shaft from a source external to the meter housing, such as by a key inserted into the end of a bolt of a lock acting as the shaft opposite the actuator-lock arm, effects rotation of the shaft and the coaxial rotation therewith of the actuator-lock arm.

The invention which is sought to be protected will be particularly pointed out and distinctly claimed in the claims appended hereto and forming a part of the specification however, it is believed that this invention, and the manner in which its objects and advantages are obtained as well as other objects and advantages thereof, will be more readily understood by reference to the following detailed description of a preferred embodiment thereof, particularly when considered in light of the accompanying drawing.

BRIEF DESCRIPTION OF THE DRAWING

FIG. 1 is a perspective view of a key operated meter cover mounted access and reset actuator apparatus in accordance with the present invention.

FIG. 2 is an end view of the key operated meter cover access and reset actuator apparatus of the present invention depicting the actuator-lock arm and cam surface with the apparatus in the locked position taken along lines 2—2 of FIG. 3 from the inside of the housing.

FIG. 3 is a side view of FIG. 2 taken along lines 3—3 of FIG. 2.

FIG. 4 is an end view of FIG. 3 taken along lines 4—4 of FIG. 3 from the outside of the meter housing and depicting the positions of the key and the actuator-lock arm when the apparatus of the present invention is locked.

FIG. 5 is a side view similar to FIG. 3, but showing the positions of the key and the actuator-lock arm in the unlocked position to allow the hatch assembly to be opened.

FIG. 6 is a side view of the apparatus of the present invention illustrating the hatch assembly unlocked as in FIG. 5 and being opened whereby the actuator-lock arm clears the cam surface and the wall of the aperture base to allow access to the meter register.

FIG. 7 is a side view of the actuator-lock arm and cam surface illustrating the frictional engagement of the actuator-lock arm with the cam surface when the arm is rotated to the proper position to actuate the control means to impart a control function to the meter register while maintaining the hatch assembly closed or locked.

DESCRIPTION OF THE PREFERRED EMBODIMENT

Reference is now made to the drawing and the preferred embodiment wherein like numerals are used in the several figures to indicate like parts throughout. In FIG. 1, an apparatus generally designated 10 for gaining access to a meter register 12 and for carrying out a control function of the register is shown mounted to a meter cover or housing 14.

The apparatus 10 is generally comprised of an apertured base 16 cylindrical in shape which extends through a corresponding or mating aperture 18 formed in the housing 14. As best seen in FIG. 3, the base 16 has a shoulder 20 which abuts the housing 14 and a generally cylindrical member 22 having a sloping cam with a surface 24 which extends through the aperture 18 into the housing. The base 16 is held in place in the housing by a retaining means such as toothed retaining ring 25 as shown in FIG. 2. The ring 25 is pushed over the cylindrical member 22 and forced tightly against the inside surface of the housing, whereby the teeth of the ring bite into the member 22 to prevent its pulling away from the housing surface to hold the base firmly in place in the housing.

Referring back to FIG. 1, an apertured hatch or port assembly generally designated 26 is configured to sealingly mate in the aperture or port of the base when seated against a second shoulder 28 formed on an inside wall 30 of the base 16. A seal 29, such as a rubber gasket on the hatch provides a weather tight seal and ensures against contamination getting into the meter housing. As shown, the hatch assembly 26 is pivotally attached to the base by a hinge 32 which allows the hatch to be pivoted opened and closed as shown by FIGS. 1, 5 and 6.

The hinge is made up of a bifurcated bracket 34 comprised of two members 36 and 36' forming part of the base 16. The members 36 and 36' each contain a hidden recess or slot 38 suitable sized to receive a hinge pivot 40 (see FIGS. 3–6). The other half of the hinge is provided by a hinge bracket 42 forming a part of the hatch 26. The hinge bracket 42 is made to receive hinge pivot 40 and is held in position between the members 36 and 36'. As can be seen in the drawing, the pivot is concealed in the slots 38 on the inside of each member 36 when the apparatus is assembled to the housing. A keeper or spacer 43 resides in each of the slots 38. These spacers may be formed on the surface of the housing or inserted into the slots when the apparatus is installed on the housing. The spacers 43 serve to keep the hatch and hinge assembly from wobbling inside the slots 38.

The various parts which make up the hatch assembly 26 can best be seen by reference to FIGS. 1 and 6. The hatch is basically circular in shape to mate with the base 16. A plate 44 comprising the hinge bracket 42, securely holds a lock 46. The lock 46 is comprised of a barrel member 48 having a shoulder 50 which abuts the plate 44 when the lock is inserted into the plate. A cylindrical shaped portion 52 having external threads is an integral part of the barrel 48 and contains a nut 54 which secures the lock 46 to the plate 44 when the nut is tightened against the backside of the plate.

Additionally, the lock 46 contains a rotatable cylindrical bolt or shaft member 56 extending longitudinally through the center axis of the barrel 48 and threaded portion 52. The bolt 56 has a slot or groove 58 formed in one end thereof for receiving an actuator or reset-lock arm 60. The lock arm 60 is preferably fabricated of a rigid flat steel to fit into the slot 58 whereby it is secured to the shaft 56 by a retaining screw 62 threaded into the shaft 56. The bolt 56 is held inside the lock 44 by a retaining means 64, such as a tru-arc ring, to allow the lock bolt to rotate inside the barrel while preventing it from sliding out of the barrel.

As best shown in FIGS. 1 and 2, the actuator-lock arm 60 is a substantially flat elongated member mounted somewhat off center of the rotational axis of the bolt 56. One end of the lock arm protrudes just slightly over the edge of the bolt 56, but close enough to the bolt so that the protruding end will clear the inside wall 30 of the base when the hatch is swung opened and closed as shown by FIG. 6. The other end of the lock arm extends further over the edge of the bolt 56 and is configured with an L-shaped member 66 having an actuator tip 68. As will subsequently be described, the tip 68 contacts an actuable control means shown as a reset switch 70 when the actuator arm is rotated in the proper direction with the hatch closed. Also on the arm 60 is a cam follower 72 shown as a button attached to the arm. The cam follower, which may be made of durable material such as plastic or teflon, comes into frictional contact with the cam surface (high lobe) 24 when the hatch is closed and when the lock arm is rotated to the proper position by the lock bolt 56. It will also be noted in FIG. 7 that the cam follower remains in contact with the high lobe on the cam surface to keep the hatch locked while the actuator-lock arm is rotated to actuate the reset switch 70.

The lock utilized in the preferred embodiment is a conventional dual key lock which allows the bolt to be rotated clockwise from the locked position with one key and counterclockwise from the locked position with a different key. The keys preferably can only be inserted and/or removed when the bolt of the lock is in a prescribed locked position such as shown by a key 74 inserted in the lock of FIGS. 3 and 4. The type of lock used is a conventional commercially available lock commonly referred to as a "Duo-Lock". One known supplier of such locks is The Illinois Lock Company, 301 West Hintz Road, Wheeling, Illinios 60090. The only difference between those commercially available locks and the lock used in the preferred embodiment is the modification of the bolt to include the slot 58 to accommodate the actuator-lock arm 60.

OPERATIONAL DESCRIPTION

To understand the operation of the present invention it is considered best to first consider the position of the actuator-lock arm 60 when the hatch is in the locked position as shown by FIGS. 2, 3 and 4. With the apparatus locked as shown, the cam follower 72 is in contact with the high lobe of the cam surface 24, thus preventing the hatch 26 from being hinged open. Assume now that an operator inserts a first key 74 into the lock. As an expedient for the operator, a notch 76 is formed in the handle portion of the key directing him to insert the key with the notch on the top side or facing up.

The operator can now turn the lock clockwise to unlock the hatch. With clockwise rotation of the lock, the actuator-lock arm 60 coaxially rotates with the lock bolt 56. The cam follower 72 on the actuator-lock arm now slides off of the high lobe of the cam surface and assumes a clearance position of the cam surface as seen in FIG. 5. It will be noted in FIGS. 1, 5 and 6, that when the actuator tip end 68 and the cam follower 72 are lined up with, or pointing toward, the hinge the hatch is free to be opened as shown by FIGS. 1 and 6, where FIG. 6 shows the hatch partially open and FIG. 1 shows the hatch substantially extended to its open position.

As shown in FIG. 1, the base aperture now provides an access port to the meter whereby a suitable programming probe or connector can be inserted into the aperture and plugged into a mating connector 78 to program the meter register electronics. Other suitable devices may also be inserted through the base aperture to service the meter. For example, a battery installation and removal tool could be inserted to replace a battery utilized to provide power to the meter electronics. References which disclose a meter having a connector such as connector 78 and which disclose a programmer having a programming probe for insertion in the base aperture are described in the aforementioned references, U.S. Pat. No. 4,050,020 and application Ser. No. 881,503 and application Ser. No. 724,040, both filed Sept. 17, 1976, entitled "PORTABLE PROGRAMMER FOR TIME OF DAY METERING REGISTER SYSTEM AND METHOD OF USING SAME", and assigned to the assignee of the present invention.

Let it now be assumed that the operator swings the hatch closed and turns the key counterclockwise to lock the hatch by positioning the cam follower and actuator arm to the position shown in FIGS. 2, 3 and 4. He can now remove the key.

Assume now that an operator, having read the demand register indicator dials 12, wants to reset the meter electronics for the next billing period. To do this, he inserts a second or different key, with the notch 76 up, and rotates the lock counterclockwise from the locked position. As illustrated in FIG. 7, the actuator-lock arm cam follower 72 frictionally maintains contact with the cam surface 24 during this latter rotation keeping the hatch locked. The operator will continue rotating the lock counterclockwise until the actuator tip 68 actuates the reset switch 70. Actuation of the reset switch, which is connected to the meter electronics, effects the generation of a reset signal to reset the electronics, thus preparing the register and the electronics for the next billing period. A meter disclosing a demand register and the electronics having a reset switch such as switch 70 is disclosed in the aforementioned patent application Ser. No. 881,503. In that application, the reset switch 70 is disclosed as a switch 41.

After the switch 70 has been actuated, the operator now rotates the lock clockwise back to the locked position (FIG. 3) where he can then remove the second or reset key. The hatch is now in its locked and sealed position, preventing access or meter tampering by unauthorized personnel. Note that the pivot 40 of the hinge is concealed between the members 36 and 36' so that the hatch cannot be removed without dismantling the entire apparatus.

From the preceding, it is quite obvious that two different keys would not be required for the invention to function, as a single key lock could be used which would allow complete clockwise and counterclockwise rotation of the lock in the manner described. However, from the utility company point of view, a dual key lock is desirable. By having two keys, one for meter access and one for meter reset, the access key can be issued to only authorized service personnel for entry to the register for servicing and the reset key can be issued only to authorized meter reading personnel.

Although not shown in the drawing, weather sealing gaskets are preferred between the shoulder 20 of the base 16 and the housing 14, and also between the shoulder 50 of barrel 48 and the hatch plate 44.

Also, the lock 46 preferably has built in stops so that the lock can only be rotated to a limited degree in either direction from the locked position. These stops prevent over-stressing the reset switch 70 by excessive torque applied to the lock shaft by the operator turning the key and also to allow the actuator-lock arm to stop at the precise place in relation to the hinge 32 to aid in opening the hatch. Additionally, a stop is preferably employed in the lock at its locked position, thus simplifying the insertion and removal of the keys.

While the described embodiment pertains to apparatus for actuating a reset switch to control the register electronics and for gaining access to the electronics for programming, it should be understood that the invention has applications with other devices and meters of a mechanical or electromechanical nature requiring similar access and control.

It will be apparent to those skilled in the art from the foregoing description of the present invention, that various improvements and modifications can be made in it without departing from the true scope of the invention. Accordingly, it is the intention to encompass within the scope of the appended claims the true limits and spirit of the invention.

What I claim as new and desire to secure by Letters Patent of the United States is:

1. In combination with a meter of the type including a register disposed inside a housing, apparatus for gaining access to said register and for carrying out a control function of said register from the outside of said housing comprising:
   (a) actuable control means mounted inside said housing, said control means communicating with said register to impart a control function thereto when actuated; and
   (b) a register access and control assembly including,
      (1) an apertured base extending through said housing and being mounted thereto adjacent said control means, said base having an inside wall formed by the aperture therein, and having a cam surface on the end thereof extending inside said housing,
      (2) an apertured hatch assembly pivotally attached to said base and configured to mate therewith when said hatch assembly is pivoted to a closed position and serving to provide access to said register through the aperture of said base when pivoted to an open position,
      (3) a rotatable bolt having an actuator-lock arm mounted on one end thereof for coaxial rotation with said bolt, said bolt being mounted in the aperture of said hatch assembly, whereby said actuator-lock arm can extend inside said housing when said hatch assembly is closed, said actuator-lock arm being rotatable with said bolt to a first position whereby said actuator-lock arm clears the cam surface and the inside wall of said base to allow said hatch assembly to be pivoted opened and closed, said actuator-lock arm, with said hatch assembly closed, being rotatable from said first position to a second position to contact said cam surface to securely hold said hatch assembly closed and further being rotatable through said second position to actuate said control means to impart a control function to the register while maintaining contact with said cam surface.

2. The invention in accordance with claim 1 wherein said meter further includes electronics for controlling said register and wherein said control means comprises a reset switch in communication with said electronics for providing a reset signal thereto when actuated by said actuator-lock arm to effect the control function of said register.

3. The invention in accordance with claim 1 wherein said hatch assembly is attached to said base by a hinge for pivoting the hatch opened and closed and whereby said hinge has a concealed pivot for preventing the removal of said hatch assembly from said base without dismantling said apparatus.

4. The invention in accordance with claim 1 wherein said actuator lock-arm contains an actuator tip on one end thereof for actuating said control means and a cam follower means which contacts said cam surface to hold said hatch assembly closed.

5. The invention in accordance with claim 1 wherein said register access and control assembly includes means for sealing the apertured hatch and base assemblies when said hatch assembly is closed to prevent contamination of said register.

6. In combination with a demand meter of the type including a register having programmable electronics disposed inside a housing, apparatus for gaining access to said register to program the electronics thereof and for electronically resetting the electronics of said register from the outside of said housing comprising:
   (a) a reset switch mounted inside said housing for providing a reset signal to the electronics of said register when actuated; and
   (b) a register access and reset actuator assembly including,
      (1) an apertured base extending through said housing and being mounted thereto adjacent said reset switch, said base having an inside wall formed by the aperture therein, and having a cam surface on the end thereof extending inside said housing,
      (2) an apertured hatch assembly pivotally attached to said base and configured to mate therewith when said hatch assembly is pivoted to a closed position and serving to provide access to said register through the aperture of said base when pivoted to an open position to allow programming the electronics of said register,
      (3) a key operated lock mounted in the aperture of said hatch assembly including a bolt rotatable by a key inserted in said lock, said bolt having a reset-lock arm mounted on one end thereof for coaxial rotation with said bolt when said bolt is rotated by said key, said reset-lock arm being capable of extending inside said housing through the aperture of said base when said hatch assembly is closed, said reset-lock arm being rotatable with said bolt to a first position with rotation of said key whereby said reset-lock arm clears the cam surface and the inside wall of said base to allow said hatch assembly to be pivotally opened and closed, said reset-lock arm, with said hatch assembly closed, being rotatable from said first position to a second position with rotation of said key to contact said cam surface to lock said hatch assembly closed upon removal of said key from said lock and further being rotatable through said second position with rotation of said key to actuate said reset switch to provide said reset signal to the electronics of said register while maintaining contact with said cam surface to keep said hatch assembly closed during the actuation of said reset switch.

7. The invention in accordance with claim 6, wherein said reset switch is mounted on said register and wired to the electronics of said register to provide the reset signal to the electronics when actuated by said reset-lock arm.

8. The invention in accordance with claim 6, wherein said hatch assembly is attached to said base by a hinge for pivoting the hatch opened and closed and whereby said hinge has a concealed pivot for preventing the removal of said hatch assembly from said base without dismantling said apparatus.

9. The invention in accordance with claim 6, wherein said reset-lock arm contains an actuator tip on one end thereof for actuating said reset switch and a cam follower means which contacts said cam surface to keep said hatch assembly closed during the actuation of said reset switch.

10. The invention in accordance with claim 6, wherein said register access and reset actuator assembly includes means for sealing the apertured hatch and base assemblies when said hatch assembly is closed to prevent contamination of the register and the electronics.

11. In combination with a demand meter of the type having a demand register disposed inside a housing, apparatus for gaining access to said register and for resetting said register from the outside of said housing comprising:
 (a) actuable reset means mounted inside said housing and communicating with said register for resetting said register when acutated; and
 (b) a register access and reset actuator assembly including,
  (1) an apertured base extending through said housing and being mounted thereto adjacent said reset means, said base having an inside wall formed by the aperture thereof, and having a cam surface on the end thereof extending inside said housing,
  (2) an apertured hatch assembly pivotally attached to said base and configured to mate therewith when said hatch assembly is pivoted to the closed position and serving to provide an access opening to said register through the aperture of said base when pivoted to an open position,
  (3) a two key operated lock mounted in the aperture of said hatch-assembly including a bolt rotatable by the rotation of either of the two keys when inserted in said lock, said bolt having a reset-lock arm mounted on one end thereof for coaxial rotation with said bolt, said reset-lock arm being capable of extending inside said housing through the aperture of said base when said hatch assembly is closed, said reset-lock arm being rotatable with said bolt to a first position by the rotation of a first key inserted in said lock whereby said reset-lock arm clears said cam surface and the inside wall of said base to allow said hatch assembly to be pivotally opened and closed, said reset-lock arm, with said hatch assembly closed, being rotable from said first position to a second position with rotation of said first key to contact the cam surface of said base to lock said hatch assembly upon removal of said first key from said lock, and said reset lock arm further being rotatable through said second position by rotation of a second key inserted in said lock to actuate said reset means while maintaining contact with the cam surface to keep said hatch assembly closed, said second key, when rotated to return said reset-lock arm to said second position, locking said hatch assembly to prevent unauthorized access to said register upon removal of said second key from said lock.

12. The invention in accordance with claim 11, wherein said demand register includes electronics for controlling said register and wherein said reset means comprises a reset switch in communication with said electronics for providing a reset signal thereto when actuated by said reset-lock arm to effect the resetting of said demand register.

13. The invention in accordance with claim 11, wherein said hatch assembly is attached to said base by a hinge for pivoting the hatch opened and closed and whereby said hinge has a concealed pivot for preventing the removal of said hatch assembly from said base without dismantling said apparatus.

14. The invention in accordance with claim 11, whereby said reset-lock arm contains an actuator tip on one end thereof for actuating said reset means and a cam follower means which contacts said cam surface to lock said hatch assembly closed upon removal of either of said first and second keys.

15. The invention in accordance with claim 11, wherein said register access and reset actuator assembly includes means for sealing the apertured hatch and base assemblies when said hatch assembly is locked to prevent contamination of said demand register.

16. In combination with an electronically programmable meter of the type having a register disposed inside a housing, the register being provided with electronic circuitry for controlling the operation of the register, apparatus for resetting the circuitry while the meter is locked and for unlocking the meter to allow the insertion of a probe into the housing to program the electronics of said meter comprising:
 (a) a mechanically actuable reset switch mounted on said register inside said housing and connected to said circuitry for providing a reset signal thereto when actuated;
 (b) an apertured base assembly having a cam surface on one end thereof mounted to said housing and extending through an aperture in said housing with said cam surface disposed inside said housing;
 (c) a hatch, including a key lock assembly, hinge mounted to said base assembly on the outside of said housing for hinging into opened and closed positions, said key lock assembly being comprised of a rotatable key operated bolt extending into said housing through said base assembly when said hatch assembly is in the closed position, said bolt having a reset-lock arm attached at one end thereof for coaxial rotation with said bolt and being disposed inside said housing when said hatch assembly is in the closed position, said reset-lock arm being rotatable with said bolt in one direction when said hatch assembly is closed to contact said cam surface to keep said hatch assembly locked in the closed position, and to actuate said reset switch to reset the electronic circuitry, and said reset-lock arm, when rotated with said bolt to a predetermined position in the other direction, riding off of the cam surface to unlock said hatch assembly, whereby said hatch assembly can be hinged to the open position to allow the probe to be inserted into the housing to program the meter.

17. Apparatus for gaining access to a serviceable device mounted inside a housing and for affecting the operation of the device by imparting a control function thereto from the outside of the housing comprising,
 (a) actuable control means mounted inside said housing and coupled to said device for imparting a control function thereto when actuated;
 (b) a hatch and rotatable key lock assembly hinge mounted to said housing and extending through an aperture therein adjacent said control means, said hatch and rotable key lock assembly including,
  (1) a cam having a sloping surface surrounding the aperture in said housing,
  (2) an actuator lock arm attached to the lock and adapted to extend through the aperture into the inside of the housing when the hatch is closed, said actuator lock arm being rotatable with the lock in first and second directions when a key is inserted in the lock, said actuator lock arm, when rotated in the first direction while the hatch assembly is closed, coming into sliding engagement with the cam surface to secure the hatch assembly closed while, with continued rotation in the first direction, actuating said control means to impart a control function to said device, and said actuator lock arm, when rotated in the second direction, slidingly disengaging from the cam surface with sufficient clearance between said actuator lock and the cam surface to allow the hatch assembly to be opened for access to said device, the key being removable to lock the hatch when said actuator lock arm is in engagement with the cam surface.

* * * * *